(12) United States Patent
May

(10) Patent No.: US 9,773,650 B2
(45) Date of Patent: Sep. 26, 2017

(54) METHOD AND DEVICE FOR GENERATING AN ELECTRICAL DISCHARGE

(71) Applicant: CemeCon AG, Wurselen (DE)

(72) Inventor: Walter May, Aachen (DE)

(73) Assignee: CemeCon AG, Würselen (DE)

( * ) Notice: Subject to any disclaimer, the term of this patent is extended or adjusted under 35 U.S.C. 154(b) by 0 days.

(21) Appl. No.: 14/923,303

(22) Filed: Oct. 26, 2015

(65) Prior Publication Data

US 2016/0118231 A1    Apr. 28, 2016

(30) Foreign Application Priority Data

Oct. 24, 2014    (DE) .................. 10 2014 115 492

(51) Int. Cl.
| | |
|---|---|
| *C23C 14/35* | (2006.01) |
| *H01J 37/34* | (2006.01) |
| *H01J 37/32* | (2006.01) |
| *H05H 1/48* | (2006.01) |
| *C23F 4/04* | (2006.01) |

(52) U.S. Cl.
CPC .......... *H01J 37/3411* (2013.01); *C23C 14/35* (2013.01); *C23F 4/04* (2013.01); *H01J 37/3244* (2013.01); *H01J 37/32596* (2013.01); *H01J 37/3405* (2013.01); *H05H 1/48* (2013.01)

(58) Field of Classification Search
CPC ........ C23C 14/35; C23F 4/04; H01J 37/3244; H01J 37/32596; H01J 37/3405; H01J 37/3411; H05H 1/48
USPC ............. 204/192.12, 192.38, 298.41, 298.07
See application file for complete search history.

(56) References Cited

U.S. PATENT DOCUMENTS

| | | | | |
|---|---|---|---|---|
| 3,626,234 A | * | 12/1971 | Grimm ................... | H01J 17/40 313/237 |
| 4,475,063 A | | 10/1984 | Aston | |
| 5,587,093 A | * | 12/1996 | Aston ..................... | H05H 1/50 219/121.36 |
| 7,014,889 B2 | | 3/2006 | Groves et al. | |
| 7,728,498 B2 | | 6/2010 | Shonka et al. | |

(Continued)

FOREIGN PATENT DOCUMENTS

| | | |
|---|---|---|
| DE | 100 60 002 A1 | 7/2001 |
| DE | 102 45 392 B3 | 1/2004 |

(Continued)

OTHER PUBLICATIONS

Machine Translation of JP 2010-248548 dated Nov. 2010.*

(Continued)

*Primary Examiner* — Rodney McDonald
(74) *Attorney, Agent, or Firm* — Flaster/Greenberg P.C.

(57) ABSTRACT

A device and method for generating an electrical discharge are described. A first electrode (30) is operated to be a cathode relative to a second electrode (16). A gas is introduced into the chamber (14) by the first electrode (30). The first electrode (30) has a closed antechamber (32) with a metal wall (34). A tube (36) consisting of a different material than the wall (34) is provided through which the gas from the antechamber (32) is conducted into the chamber (14). A front portion of the tube (36) is embedded in the wall (34) of the antechamber (32). In its rear portion, the tube (36) has a free end projecting into the antechamber (32). A stable electrical discharge can be generated thereby in a particularly easy manner.

15 Claims, 2 Drawing Sheets

(56) References Cited

U.S. PATENT DOCUMENTS

2005/0126487 A1    6/2005   Tabuchi et al.
2011/0180389 A1    7/2011   Cremer et al.

FOREIGN PATENT DOCUMENTS

| | | |
|---|---|---|
| DE | 10 2004 015 230 A1 | 10/2005 |
| DE | 10 2004 015 231 A1 | 10/2005 |
| DE | 10 2006 021 994 A1 | 11/2007 |
| DE | 10 2011 056 555 B3 | 1/2013 |
| JP | 2010-248548 * | 11/2010 |
| WO | WO 98/46807 A1 | 10/1998 |
| WO | WO 2009/132822 A2 | 11/2009 |

OTHER PUBLICATIONS

Fraunhofer FEP, "Hollow Cathode Arc Enhancement in Reactive PVD Process," 1 page, (Jun. 2013).

A. Sherman, "In Situ Removal of Native Oxide from Silicon Wafers," J. Vacuum Science & Technology, 8, 656, (1990), pp. 656-657.

European Extended Search Report 9 pages (Mar. 18, 2016).

\* cited by examiner

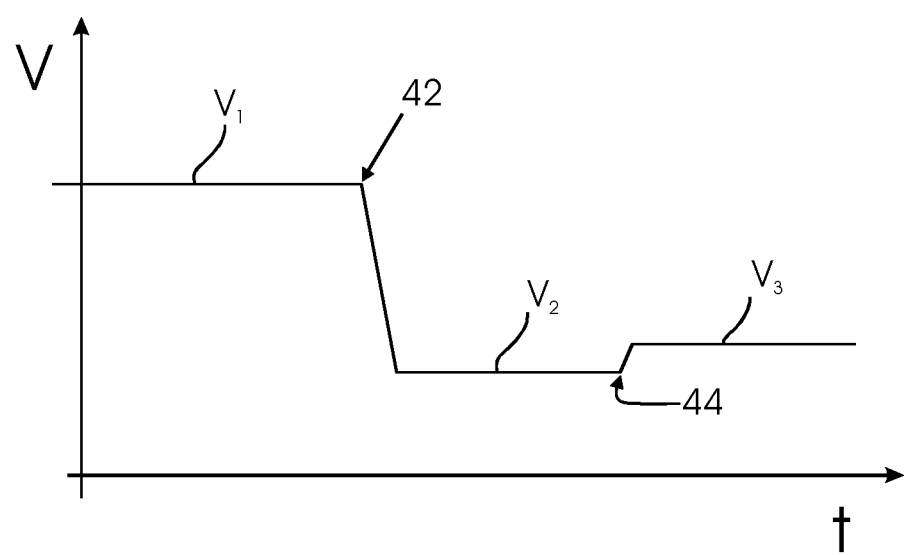

METHOD AND DEVICE FOR GENERATING AN ELECTRICAL DISCHARGE

BACKGROUND OF THE INVENTION

Field of the Invention

The invention relates to a device and method for generating an electrical discharge. In particular, the invention relates to the generation of an electrical charge within a chamber, such as a vacuum chamber for plasma treatment.

Description of Related Art

A plurality of devices and methods are known in which workpieces are treated within a vacuum chamber with an electrically generated plasma, for example in the form of plasma coating or plasma etching.

For example, DE 10 2006 021 994 A1 describes a coating method and a device for coating bodies by means of magnetron sputtering. Magnetrons are connected to a common anode in a PVD magnetron coating chamber. Substrates are guided along the magnetrons on a turntable. A magnetron can be operated in pulses or with constant power by means of two power supplies. Directly before being coated, the substrate is subjected to a plasma etching treatment in which a negative potential is applied to the substrate which is bombarded with argon ions to clean and activate the surface.

DE 10 2004 015 231 A1 describes a method and a device for treating substrate surfaces by bombarding with charge carriers. For surface treatment, a high-current gas discharge is formed between an electron emission device and an electrode connected as an anode. After evacuating a vacuum chamber, a hollow cathode installed in the wall of the chamber is activated with a heated tungsten tube, a cooled housing, an inlet device for the argon carrier gas, and an auxiliary electrode with a positive bias voltage which promotes the ignition and stabilization of a hollow cathode arc discharge.

DE 10 2004 015 230 A1 describes a method and a device for enhancing a pulsed magnetron discharge. An electrode is arranged in a magnetron magnetic field and temporarily operated to be a cathode relative to a counter-electrode. In time intervals in which the first electrode is not operated as a cathode, an additional electron current from an additional electron source is conducted to the first electrode. Hollow cathodes with a hot cathode as well as wire or bolt cathodes of tungsten, or respectively lanthanum hexaboride/tungsten are cited as the electron sources. In one embodiment, argon gas flows through a tubular hot cathode.

DE 100 60 002 A1 describes a device for surface treatment using a plasma generation chamber which is provided with a plasma generation electrode, and a substrate treatment chamber that is provided with a substrate support table. A plasma nozzle is used to as a generating area for a hollow anode discharge.

In the article by A. Sherman "In situ removal of native oxide from silicon wafers", J. Vac. Sci. Technol. B. 8, 1990, 4, 656, 657, a water-cooled hollow cathode consisting of molybdenum as the electron source is used for a DC discharge for CVD deposition on silicon.

BRIEF SUMMARY OF THE INVENTION

It can be considered an object of the invention to propose a device and method by means of which an electrical discharge can be easily generated or supported in a chamber.

The object is achieved by a device according to claim 1 and a method according to claim 11. Dependent claims refer to advantageous embodiments of the invention.

According to the invention, at least one first and one second electrode are provided in a chamber, preferably a vacuum chamber. At least temporarily, the first electrode can be operated as a cathode and the second electrode can be operated as an anode by an electrical power supply.

A gas is conducted into the chamber through the first electrode operated as a cathode. According to the invention, first gas is fed into a closed antechamber which has a metal wall. From the antechamber, the gas passes through a tube into the chamber.

According to the invention, the tube is aligned on the wall of the antechamber so that its front portion facing into the direction of the chamber, through which the gas passes into the chamber, is embedded in the wall of the antechamber, whereas its rear portion, into which the gas passes from the antechamber, projects freely into the antechamber.

With an electrode designed in this manner, the front portion of the tube embedded in the wall is effectively thermally coupled to the wall of the antechamber so that heat arising in the antechamber is conducted through the wall of the antechamber, which preferably consists of an effectively thermally conducting metal such as copper. However, the rear end of the tube projects freely into the antechamber and is therefore much less effectively thermally coupled to the wall of the antechamber. Accordingly, the material of the tube can heat up at this location.

When gas is guided through the tube into the chamber, a hollow cathode discharge can form in the tube, in particular a hollow cathode arc discharge. It has been shown that by strongly heating the free end of the tube that extends into the antechamber and into which the gas from the antechamber flows, electrons are emitted from the tube material at that location due to thermionic emission. The electrons support the formation of a hollow cathode arc discharge and pass together with the gas stream through the tube into the chamber. This yields high ionization suitable for plasma treatment in the chamber.

In preferred embodiments, the tube consists of a different material than the wall of the antechamber in which it is embedded. This makes it possible to be able to select the respective material for the wall and the tube independent of each other corresponding to the desired function. The tube can for example be fittingly inserted or pressed into an opening formed in the material of the wall of the antechamber to achieve effective contact between the wall and the tube.

The tube should preferably consist of a material that is resistant to temperatures which result from the arising electrical discharges. This can prevent excessive consumption. Different materials can be used for the tube material, especially metals and ceramic materials. Highly temperature-resistant materials are preferred, i.e., those that have a particularly high melting point above 1500° C. and preferably above 2000° C. In the preferred embodiments, the tube can for example consist of tantalum, tungsten or lanthanum hexaboride ($LaB_6$). Tantalum is particularly preferable as the material. A tube formed from these materials has proven resistant and scarcely shows consumption despite the high temperatures achieved from the arising discharges.

It is useful for the material of the antechamber wall to be easily processable and deformable to form the wall, especially a solid wall. A wall material is preferred that has effective thermal conductivity, such as more than 100 W/(mK), preferably more than 200 W/(mK), particularly preferably more than 300 W/(mK), in order to dissipate the heat arising during the discharge. For example, aluminium can be used; however, copper or an alloy is preferred that consists at least primarily, i.e., more than 50 atomic percent, of copper. A material with a particularly high melting point is contrastingly not required for the material of the antechamber; for example, a metal can be used with a melting point of less than 1200° C.

The tube can preferably have a round cross-section. More preferably it has an elongated shape, i.e., its axial length is longer than the outer diameter, preferably more than twice as large, more preferably more than three times as large as the diameter. For example, the tube can have a length of 10-40 mm, preferably 20-30 mm. For example dimensions of 4-15 mm, preferably 10 mm or less are conceivable as the outer diameter. The inner diameter can for example be less than 10 mm, preferably 6 mm or less.

Further, it is preferred that at least one-half of the length of the tube freely projects into the antechamber. In the front portion, it is preferable for the tube to terminate at least substantially at the wall, i.e., not extend, or only extend slightly, out of the wall into the chamber.

A feed tube can be provided for feeding gas into the antechamber. The feed tube can serve to introduce the gas without itself participating in the discharge. A front, free end of the feed tube can extend into the antechamber. Furthermore, the feeding tube can have equivalent or similar properties as the tube between the antechamber and chamber, i.e., a highly temperature-resistant material is preferred as the material such as tantalum, tungsten or lanthanum hexaboride, the feed tube can have a round cross-section and elongated shape and can project into the antechamber for more than one-half its length. In the rear portion, the feed tube is preferably embedded in highly thermally-conductive material.

BRIEF DESCRIPTION OF THE SEVERAL VIEWS OF THE DRAWINGS

In the following, an embodiment of the invention will be further described with reference to the drawings. In the drawings:

FIG. 3 shows a diagram of the voltage characteristic between the electrodes from FIG. 1 over time.

DETAILED DESCRIPTION OF THE INVENTION

Figure 1:
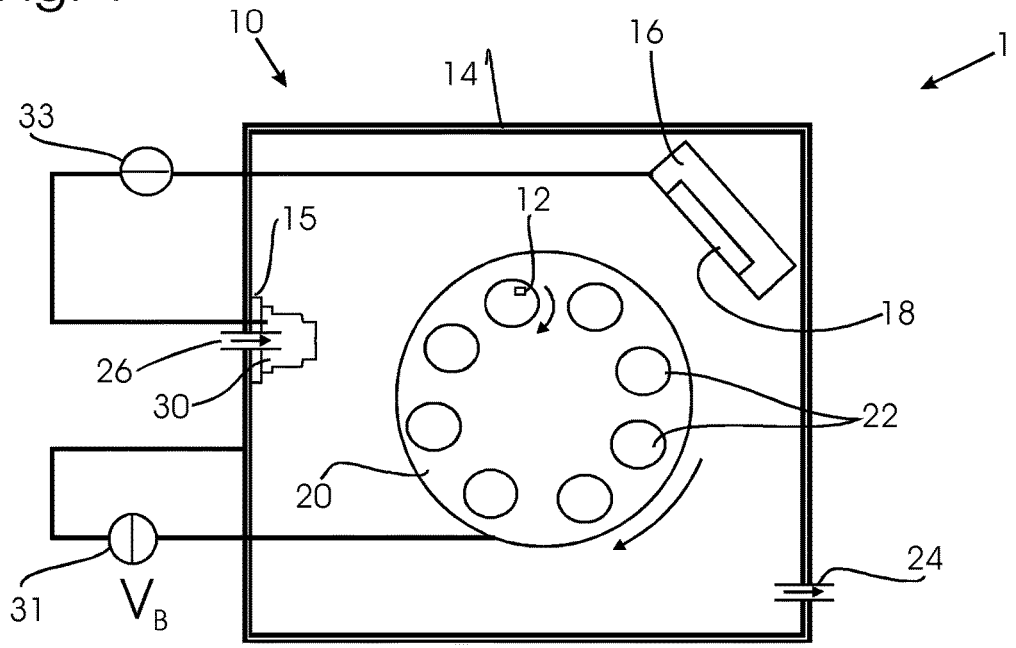
FIG. 1 shows a schematic representation of a vacuum chamber with electrodes.

FIG. 1 schematically portrays a PVD sputtering system 10 for coating substrates 12. A magnetron cathode 16 with a sputtering target 18 consisting of a material to be sputtered is arranged in a vacuum chamber 14. A rotatable substrate table 20 is located in the chamber 14. Substrate holders 22 rotate on the substrate table 20 with substrates 12 arranged thereupon to be treated, of which only one substrate 12 is symbolically shown in FIG. 1.

A bias power supply 31 is provided on the substrate table 20 by means of which the substrates 12 are held as recipients at a negative potential, compared to the conductive wall of the chamber 14.

The chamber 14 has a gas outlet 24 by means of which a vacuum is generated in the interior of the chamber 14 by a pump system (not shown). Working gas, preferably argon, as well as additionally also reactive gas such as nitrogen depending on the desired treatment, can be fed through a gas inlet 26.

With the coating system 10 shown in FIG. 1, the gas inlet 26 is connected to the interior of the chamber 14 by a special electrode 30 so that the gas flows through the electrode 30 into the chamber. An electrical power supply 33 is provided between the electrode 30 and the magnetron cathode 16.

The PVD coating system 10 is only schematically portrayed in this context with a few of the elements contained therein. PVD coating systems and in particular systems for magnetron sputtering are known per se. The substrates 12 are coated by igniting a plasma in the interior of the chamber 14. Ions of the plasma sputter the target 18. Components of the plasma deposit on the surface of the substrates 12. During the coating, the electrode 30 can be operated to be an anode relative to the magnetron cathode 16.

In addition to the elements shown in FIG. 1, sputter systems normally have additional elements such as additional sputter cathodes, in particular magnetron cathodes of the unbalanced type (UBM). The detailed description and explanation of other elements with which a person skilled in the art is familiar will not be addressed in this context. For example, WO 98/46807 A1 shows a PVD coating system of which the electric configuration with a bias power supply, separate power supplies for a number of magnetron cathodes and an additional power supply between the metal wall of the chamber 14 and a separate anode are described. WO 2009/132822 describes a PVD system and coating methods implemented therewith in which at least some of the sputter cathodes are used with high-energy pulses in HPPMS mode. These documents and the systems and methods described therein are incorporated by reference with regard to potential elements of a sputtering system and its electrical circuitry.

To clean and activate the surface of the substrates 12 before the actual coating in the sputtering procedure, preferably ion etching is first performed in which charged particles act on the surface of the substrates 12. In the portrayed example in FIG. 1, this etching occurs by an electrical discharge which forms between the magnetron cathode 16 and the electrode 30 on the gas inlet 26. The electrode 30 is operated as a cathode, whereas the electrode 16 is operated as anode (due to its use as a cathode in the subsequent coating procedure, the electrode 16 is referred to as "magnetron cathode").

The electrode 30 in the portrayed example is placed on the wall of the chamber 14 approximately in the middle. It is electrically insulated from the electrically conductive chamber wall 14 by an insulation layer 15. The electrode 30 and the magnetron cathode 16 operated as a counter electrode are arranged opposite each other in the chamber 14 so that the substrates are located in the area between.

Figure 2:
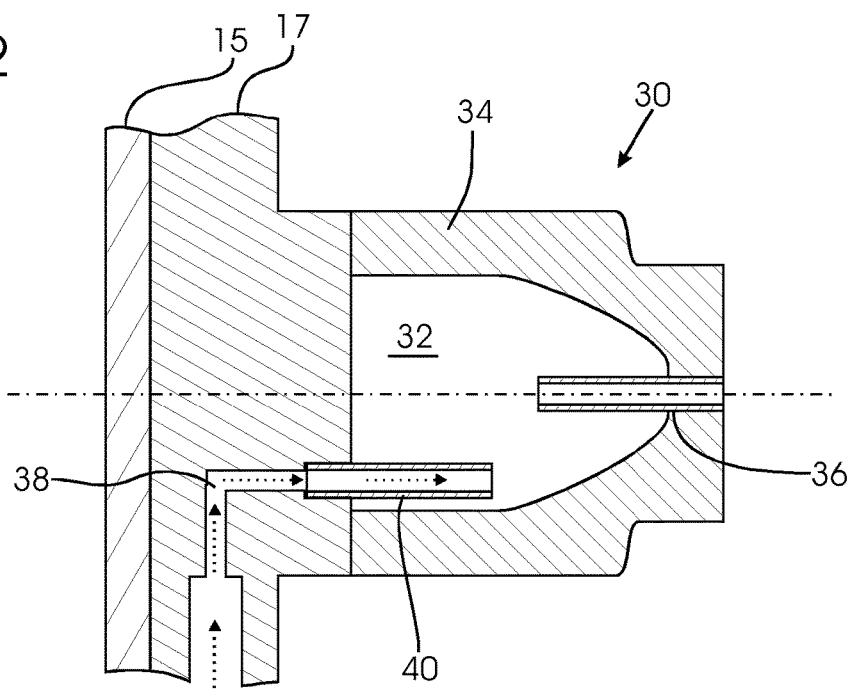
FIG. 2 shows a cross-section of a first electrode of the chamber from FIG. 1.

FIG. 2 shows a schematic cross-section of the structure of the electrode 30. The electrode 30 comprises a base plate 17 and a dome 34 placed thereupon which are formed from electrically conductive material. In a preferred embodiment, in particular the dome 34 has a thick copper wall which encloses an antechamber 32. The dome 34 is placed directly on the baseplate 17 so that they electrically contact each other. Accordingly, the antechamber is surrounded by a wall made of a consistently conductive material so that the wall always has a uniform electrical potential during operation. Preferably, a liquid cooler for the electrode 30 can be provided on the base plate 17.

The antechamber 32 is sealed from the interior of the chamber 14 and is connected thereto only by a tube, or respectively tubule 36. The gas is supplied through a channel 38 in the wall of the base plate 17, in this case, preferably argon as the working gas.

The supplied gas passes through the channel 38 in the base plate 17 as well as through a feed tubule 40 into the interior of the antechamber 32. The gas then passes from the antechamber 32 through the tubule 36 into the interior of the chamber 14.

As shown in FIG. 2, the tubule 36 is a part separate from the wall of the antechamber 32 from which a front section facing the interior of the chamber 14, that approximately corresponds to one-third of the overall length of the tubule 36, is embedded in the wall 34 of the antechamber 32.

The material of the tubule 36 differs from the material of the wall of the antechamber 32, in particular from the material of the dome 34. The dome 34 is made of copper as a highly thermally-conductive material which, however, is not highly temperature-resistant. In contrast, the tubule consists of a highly temperature-resistant material, preferably tantalum.

In the preferred embodiment, the tubule 36 has a length of 25 mm, an inner diameter of 4 mm and an outer diameter of 6 mm. By being embedded in the relatively thick copper wall 34, the front portion of the tantalum tubule 36 is effectively coupled thermally to a relatively large thermal reservoir so that heat is quickly removed therefrom.

The rear end of the tantalum tubule 36 freely projects into the interior of the antechamber 32. The rear portion of the tantalum tubule 36 projecting freely into the antechamber 32 corresponds to more than one-half of the entire length of the tubule. As a result, the rear end of the tubule 36 is not directly thermally coupled to the wall 34 of the antechamber 32 so that any heat arising there is not directly removed through the wall 34.

The feed tube 40 also projects into the antechamber 32 in the depicted example. The feed tube 40 also consists of tantalum and can have approximately the same dimensions as the tubule 36. The front section of the feed tubule 40 projects freely into the interior of the antechamber 32. It serves to introduce the working gas into the antechamber 32 and accordingly has the function of a nozzle but does not participate in the discharge.

When the system 10 is in etching mode according to the sketch in FIG. 1, the power supply 33 operates as a current source with a set current. This initially leads to the application of a voltage of, for example, 400-900V. When argon is simultaneously fed as the working gas through the channel 38 and the feed tubule 40, a hollow cathode discharge initially forms, thus causing the tubule 36 to be heated. In the process, a temperature distribution arises over the length of the tubule 36 in which the rear end of the tubule 36 has a significantly higher temperature than the front end because the heat at the front end is removed through the wall 34.

If, because of the heating, the material of the tubule 36 enters a temperature range in which a significant emission of electrons from the material arises from the thermoelectric effect, these electrons primarily leave the rear end of the tubule 36 and lead to the formation of a hollow cathode arc discharge. The electrons pass through the tubule 36 with the gas stream into the interior of the chamber 14. Within the interior of the chamber 14, the electrons are attracted by the magnetron cathode 16 operated as an anode and accelerated in its direction. Due to the accelerated electrons, the ionization of components within the interior of the chamber 14 is enhanced, in particular to form argon ions by means of which the surface of the substrate 12 can be treated.

It has been observed that the tubule 36 only experiences relatively slight wear, or respectively consumption. The discharge triggered at that location is very stable and easily reproducible, in particular after achieving a heating temperature of approximately 2500° C.

FIG. 3 shows an example of a characteristic curve of the voltage V over time t applied between the electrodes 30, 16. At that location, an ignition voltage $V_1$ of for example approximately 700 V arises from the power supply 33. After a while, the hollow cathode discharge is triggered at point 42 so that the voltage drops to a significantly lower value of for example 50 V.

The tubule 36 heats up in particular at its rear end until, after an interval of time, the effect of thermionic emission from the tantalum material of the tubule 36 at its rear end is quite noticeable at time 44 which changes the discharge into a hollow cathode arc discharge, and a slight rise to a third voltage $V_3$ occurs. The third voltage $V_3$ can for example be 65 V and accordingly lies slightly higher than the second voltage $V_2$.

The continued discharge at voltage level $V_3$ has proven to be extraordinarily stable.

A number of changes, or respectively alternatives are possible to the depicted embodiments. In addition to the electrode 30, one or more additional electrodes of this kind can be provided in particular in the system according to FIG. 1. Preferably, a separate additional power supply can be provided for each of the electrodes, and more preferably, each can be connected to a separate counter electrode. As with the arrangement of the electrodes 16, 30 shown in FIG. 1, it is furthermore preferable for the holder for the substrates 12 to be arranged between the electrodes in order for the arising plasma to have an effect on the substrates 12.

Whereas in the above example, the depicted system 1 is a sputtering system, a treatment by the discharge between the electrodes 16 and 30 can also be used independently thereof in any other chamber, or respectively any other type of plasma treatment system.

I claim:

1. A device for generating an electrical discharge comprising:
    at least a first and a second electrode in a chamber, wherein an electrical power supply is provided in order to operate the first electrode as a cathode and the second electrode as an anode,
    wherein the first electrode has a closed antechamber with a metal wall and a gas supply into the antechamber,
    wherein a tube consisting of a material different from the material of the wall of the antechamber is provided in order to conduct gas directly from the antechamber into the chamber, wherein a front portion of the tube facing the chamber is embedded in the wall of the antechamber,
    wherein a rear portion of the tube has an end freely projecting into the antechamber into which gas from the antechamber can enter, and
    wherein more than one half of a length of the tube projects freely into the antechamber.

2. The device according to claim 1, wherein the tube consists of a material that has a melting point above 1500° C.

3. The device according to claim 1, wherein the tube consists of tantalum, tungsten or lanthanum hexaboride.

4. The device according to claim 1, wherein the wall of the antechamber consists of a metal with a thermal conductivity greater than 100 W/(mK).

5. The device according to claim 1, wherein the wall of the antechamber consists of a metal with a melting point of less than 1200° C.

6. The device according to claim 1, wherein the length of the tube is more than twice as large as its outer diameter.

7. The device according to claim 1, wherein the front portion of the tube terminates at the wall.

8. The device according to claim 1, wherein a feed tube is provided so that gas can be introduced through it into the antechamber.

9. The device according to claim 8, wherein a front-end of the feed tube out of which gas can flow into the antechamber projects into the antechamber.

10. The device according to claim 1, wherein the material of the antechamber wall is copper or an alloy that consists of more than 50 atomic percent of copper.

11. The device according to claim 1, wherein the tube consists of a material with a melting point above 2000° C.

12. The device according to claim 1, wherein the electrode comprises a base plate and a dome, and a liquid cooler for the electrodes is provided on the base plate.

13. A method for generating an electrical discharge, wherein:
in a chamber, a first electrode is operated as a cathode relative to a second electrode,
and a gas is introduced into the chamber through the first electrode, wherein the gas is conducted through a closed antechamber of the first electrode with a metal wall,
and wherein gas from the antechamber is directly conducted into the chamber through a tube consisting of a material different from the material of the wall of the antechamber, wherein a front portion of the tube out of which the gas exits is embedded in the wall of the antechamber, wherein a rear portion of the tube into which the gas from the antechamber enters has an end freely projecting into the antechamber, and wherein more than one half of a length of the tube projects freely into the antechamber.

14. A device for generating an electrical discharge comprising:
at least a first and a second electrode in a chamber, wherein an electrical power supply is provided in order to operate the first electrode as a cathode and the second electrode as an anode,
wherein the first electrode has a closed antechamber with a metal wall and a gas supply into the antechamber,
wherein a tube consisting of a material different from the material of the wall of the antechamber is provided in order to conduct gas directly from the antechamber into the chamber, wherein a front portion of the tube facing the chamber is embedded in the wall of the antechamber,
wherein a rear portion of the tube has an end freely projecting into the antechamber into which gas from the antechamber can enter.

15. A device for generating an electrical discharge comprising:
at least a first and a second electrode in a chamber, wherein an electrical power supply is provided in order to operate the first electrode as a cathode and the second electrode as an anode,
wherein the first electrode has a closed antechamber with a metal wall and a gas supply into the antechamber,
wherein a tube consisting of a material different from the material of the wall of the antechamber is provided in order to conduct gas from the antechamber into the chamber, wherein a front portion of the tube facing the chamber is embedded in the wall of the antechamber,
wherein a rear portion of the tube has an end freely projecting into the antechamber into which gas from the antechamber can enter, and
wherein more than one half of a length of the tube projects freely into the antechamber.

* * * * *